United States Patent
Song et al.

(10) Patent No.: US 7,585,730 B1
(45) Date of Patent: Sep. 8, 2009

(54) METHOD OF FABRICATING A NON-VOLATILE MEMORY DEVICE

(75) Inventors: Seok Pyo Song, Seongnam-si (KR); Dong Sun Sheen, Yongin-si (KR); Young Jin Lee, Yongin-si (KR); Mi Ri Lee, Icheon-si (KR); Chi Ho Kim, Jeonju-si (KR); Gil Jae Park, Busan (KR); Bo Min Seo, Yongin-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 12/164,721

(22) Filed: Jun. 30, 2008

(30) Foreign Application Priority Data

Apr. 7, 2008 (KR) .................. 10-2008-0032274

(51) Int. Cl.
*H01L 21/8247* (2006.01)
(52) U.S. Cl. ................ 438/264; 438/594; 257/E21.179
(58) Field of Classification Search ......... 438/257–267, 438/593–594; 257/E21.179
See application file for complete search history.

(56) References Cited

U.S. PATENT DOCUMENTS

| 7,183,153 B2 * | 2/2007 | Lutze et al. ................. 438/201 |
| 7,465,631 B2 * | 12/2008 | Ahn et al. ................... 438/257 |
| 2008/0090354 A1 | 4/2008 | Baek et al. .................. 438/264 |
| 2008/0093660 A1 | 4/2008 | Park et al. ................... 257/324 |

* cited by examiner

*Primary Examiner*—Richard A. Booth
(74) *Attorney, Agent, or Firm*—Marshall, Gerstein & Borun LLP

(57) ABSTRACT

A method of fabricating a non-volatile memory device includes forming a tunneling layer and a conductive layer on a semiconductor substrate, and patterning the conductive layer, the tunneling layer, and the semiconductor substrate to form a conductive pattern, a tunneling pattern, and a trench in the semiconductor substrate. The method also includes filling the trench with a insulating material, and exposing a partial sidewall of the conductive pattern. The method further includes recessing the exposed partial sidewall of the conductive pattern in an inward direction to form a floating gate. The floating gate includes a base portion and a protruding portion having a width smaller than that of the base portion. The method also includes etching the insulating layer to form an isolation layer that exposes the base portion of the floating gate. Still further, the method includes forming a dielectric layer, that extends along the base and protruding portions of the floating gate, and a control gate that covers the base and protruding portions of the floating gate.

12 Claims, 5 Drawing Sheets

METHOD OF FABRICATING A NON-VOLATILE MEMORY DEVICE

CROSS-REFERENCE TO RELATED APPLICATION

The priority of Korean patent application No. 10-2008-0032274, filed Apr. 7, 2008, the disclosure of which is incorporated by reference in its entirety, is claimed.

BACKGROUND OF THE INVENTION

1. Field of the Invention

The invention relates to a semiconductor device, and more particularly, to a method for fabricating a non-volatile memory device.

2. Brief Description of Related Technology

A non-volatile memory device is electrically programmable and erasable, and has been widely used for electronic components where data is retained even when power is interrupted. A typical unit cell of the non-volatile memory device includes a floating gate and a control gate, and writes and erases data depending on whether electric charges are included in the floating gate.

In a floating gate type non-volatile memory device, it is important to form the floating gate to a small width because a sufficient distance should be obtained between adjacent floating gates in order to form the control gate. In particular, as high integration of a semiconductor device decreases the design rule, the pattern size is reduced. Therefore, it is difficult to form the control gate unless a sufficient distance is obtained between the floating gates. The floating gate and a semiconductor substrate are simultaneously etched for alignment of the floating gate.

FIG. 1 illustrates a cross-sectional view of a conventional non-volatile memory device.

Referring to FIG. 1, the conventional non-volatile memory device includes a tunneling layer 110, a floating gate 115, a dielectric layer 120, and a control gate 125 that are stacked on a semiconductor substrate 100. An isolation layer 105 defines an active region in the semiconductor substrate 100. An impurity region (not shown) such as source/drain regions is formed in the semiconductor substrate 100, and a channel region (not shown) is disposed between the source/drain regions. The isolation layer 105 is formed by etching the semiconductor substrate 100 to form a trench (during a process for patterning the floating gate 115), and filling the trench with a insulating layer.

When the floating gate 115 and the semiconductor substrate 100 are patterned together by etching, a width $a_1$ of the floating gate 115 is equal to a width $b_1$ of a portion of the semiconductor substrate 100 where the floating gate 115 is formed. As described above, a gap $c_1$ between adjacent floating gates 115 should be obtained in order to form the control gate 125. However, it is difficult to form the floating gate 115 so as to have the width $a_1$ different from the width $b_1$ of the semiconductor substrate 100 during a process of etching the floating gate 115 and the semiconductor substrate 100 together. As a result, the floating gate 115 may be formed so as to have a slope. However, it is difficult to ensure the floating gate 115 has sufficient height when a line width is very small. In addition, if the width $b_1$ of the semiconductor substrate 100 is small, a width of the channel region (not shown) is also reduced, thereby decreasing an operating current of a device. Therefore, it is necessary to obtain the gap $c_1$ between the adjacent floating gates 115 while obtaining the sufficient width $b_1$ of the semiconductor substrate 100 under the floating gate 115. Furthermore, a method of precisely controlling the height of the floating gate 115 is required.

SUMMARY OF THE INVENTION

Disclosed herein is a method for fabricating a non-volatile memory device having a sufficient gap between adjacent floating gates.

In one embodiment, the method includes forming a tunneling layer and a conductive layer on a semiconductor substrate, and patterning each of the conductive layer, the tunneling layer, and the semiconductor substrate to form a conductive pattern, a tunneling pattern, and a trench in the substrate. The method further includes filling the trench and exposing a partial sidewall of the conductive pattern, and recessing the exposed partial sidewall of the conductive pattern in an inward direction to form a floating gate that includes a base portion and protruding portion having a width smaller than that of the base portion. The method further includes etching the insulating layer to form an isolation layer exposing the base portion of the floating gate, forming a dielectric layer that extends along the base and protruding portions of the floating gate, and forming a control gate that covers the base and protruding portions of the floating gate.

The patterning step may include forming a hard mask pattern on the conductive layer, and etching the conductive layer, the tunneling layer, and the semiconductor substrate using the hard mask pattern as an etch mask, to form the trench.

The hard mask pattern may include one or more films selected from the group consisting of a nitride film, an oxide film, and a polysilicon film, and may be removed after the floating gate is formed.

The step of recessing the conductive pattern may include oxidizing the conductive pattern to form an oxide film on the exposed partial sidewall of the conductive pattern, etching the conductive pattern to remove the oxide film, and further oxidizing and etching the sidewall.

The oxidation process may be performed by oxidizing with an oxygen plasma or oxygen radicals. Oxidizing with oxygen plasma includes applying power and supplying a source gas containing an oxygen ($O_2$) gas, an argon (Ar) gas, and a hydrogen ($H_2$) gas at a temperature of approximately 400° C. to approximately 550° C. and a pressure of approximately 0.1 Torr to approximately 2 Torr to form an oxygen plasma, and adsorbing the oxygen plasma on the conductive pattern.

The oxygen plasma may be adsorbed on the exposed partial sidewall of the conductive pattern by applying a higher bias in a lateral direction relative to a downward direction of the semiconductor substrate to ensure that the oxygen plasma is adsorbed on the exposed partial sidewall of the conductive pattern.

Oxidizing with oxygen radicals includes catalytically reacting an oxygen gas and a hydrogen gas to generate oxygen radicals, and then supplying the oxygen radicals to the exposed partial sidewall of the conductive pattern.

Preferably, the oxide film has a thickness of approximately 30% to approximately 80% of a target line width of the conductive pattern. Preferably, the oxide film removed by the etching process has a thickness of approximately 2 nm to approximately 10 nm. Preferably the exposed base portion of the floating gate has a thickness of approximately 100 Å to approximately 300 Å.

Additional features of the disclosed invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings wherein.

Figure 1:
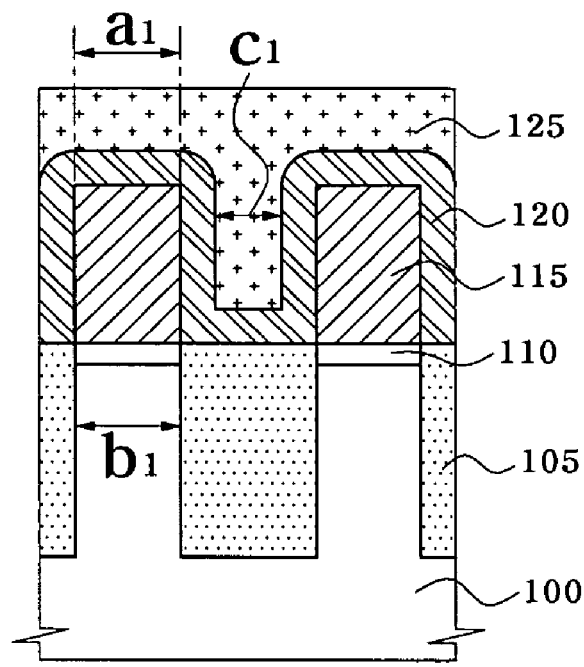
FIG. 1 illustrates a cross-sectional view of a conventional non-volatile memory device; and, FIGS. 2 to 10 illustrate cross-sectional views of one embodiment of the inventive method of making a non-volatile memory device.

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DESCRIPTION OF SPECIFIC EMBODIMENTS

Figure 2:
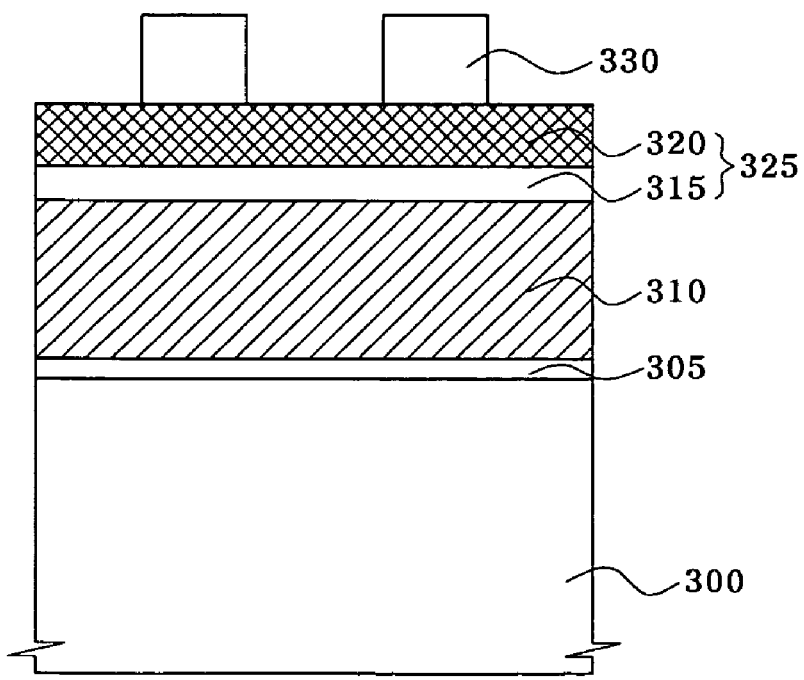

Referring to FIG. 2, a tunneling layer 305 is formed on a semiconductor substrate 300. The tunneling layer 305 allows electric charge carriers such as electrons or holes to be injected into a floating gate under a specific bias. The tunneling layer 305 may be formed by growing an oxide film. The tunneling layer 305 may be deposited using a chemical vapor deposition (CVD) method. Next, a conductive layer 310 is formed on the tunneling layer 305. The conductive layer 310 may be a single layer such as a polysilicon film, a metal film, a metal nitride film, or a combination of one or more of these films. A hard mask layer 325 is formed on the conductive layer 310. The hard mask layer 325 serves as an etch mask during an etching process for forming a trench in the semiconductor substrate 300. The hard mask layer 325 may be formed of a combination of one or more films selected from the group consisting of a nitride film, an oxide film, and a polysilicon film. The hard mask layer 325 may be a double layer of a first hard mask layer 315 and a second hard mask layer 320 having different etching selectivity according to the above-mentioned films. For example, when the first hard mask layer 315 is an oxide film, the second hard mask layer 320 may be a nitride film or a polysilicon film. Alternatively, when the first hard mask layer 315 is a nitride film, the second hard mask layer 320 may be a polysilicon film. The hard mask layer 325 may be a single layer of a nitride film in order to simplify the process. Next, a photoresist pattern 330 is formed on the hard mask layer 325. The photoresist pattern defines a region where the floating gate will be formed.

Figure 3:
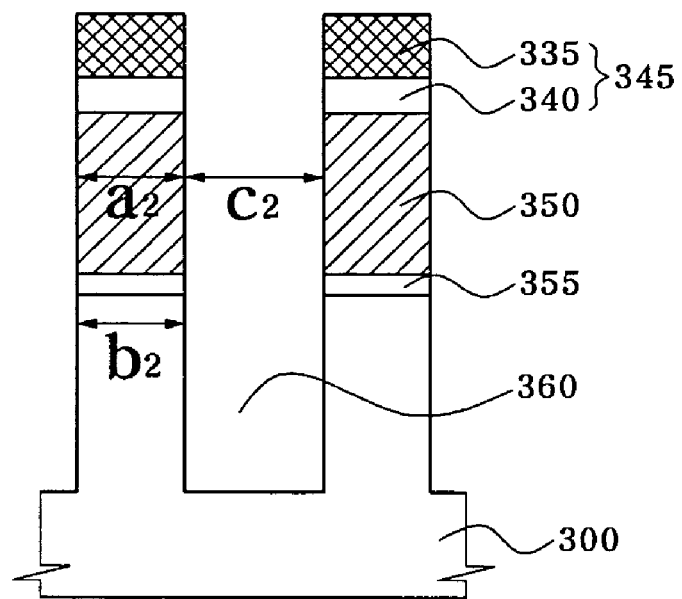

Referring to FIGS. 2 and 3, a hard mask pattern 345, which selectively exposes the conductive layer 310, is formed by etching the hard mask layer 325 using the photoresist pattern 330 as a mask. If the hard mask layer 325 is a double layer including the first hard mask layer 315 and the second hard mask layer 320, then the hard mask pattern 345 includes a first hard mask pattern 340 and a second hard mask pattern 335. The photoresist pattern 330 is removed. Next, a conductive pattern 350, which exposes the tunneling layer 305, is formed by etching the exposed conductive layer 310 using the hard mask pattern 345 as an etch mask. A tunneling pattern 355 is formed and a trench 360 having a predetermined depth is formed in the semiconductor substrate 300 by etching the exposed tunneling layer 305 and the semiconductor substrate 300. The trench 360 may be formed in the semiconductor substrate 300 by using a self-align method.

A width "$a_2$" of the conductive pattern 350, which is formed by etching the conductive layer 310 and the semiconductor substrate 300, is equal to a width "$b_2$" of the semiconductor substrate 300 under the conductive pattern 350. However, if a dielectric layer and a control gate are formed such that the width "$a_2$" of the conductive pattern 350 is equal to the width "$b_2$" of the semiconductor substrate 300, then it is difficult to form the control gate to a sufficient thickness because of a small gap "$c_2$" between adjacent conductive patterns 350. In addition, high integration of semiconductor devices decreases the gap "$c_2$" between the conductive patterns 350, thereby making it difficult to form the control gate. Therefore, it is important to obtain the gap "$c_2$" between the conductive patterns 350.

Figure 4:
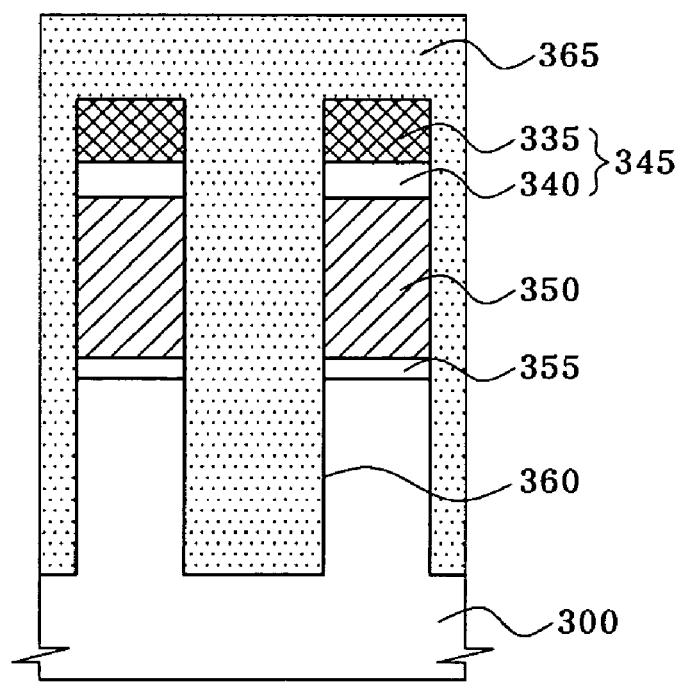

Referring to FIG. 4, a insulating layer 365 is deposited on the semiconductor substrate 300. The insulating layer 365 is formed to a sufficient thickness so as to fill the trench 360 and cover the hard mask pattern 345. The insulating layer 365 may be a single layer of an oxide film or a double layer including one or more oxide films. For example, the insulating layer 365 may be formed using one or more methods selected from the group consisting of a spin on glass (SOG) process, a ozone tetra ethyl ortho silicate (TEOS) deposition process, a hydrogen peroxide/silane based chemical vapor deposition (CVD) process, and a high density plasma (HDP) process. The insulating layer 365 is formed from 1 to 3 times thicker than a depth to be recessed in a recessing process described below. Although not shown, to improve the device characteristic, a sidewall oxide film, a liner oxide film, or a liner nitride film may be formed on an exposed surface of the trench 360 before forming the insulating layer 365.

Figure 5:
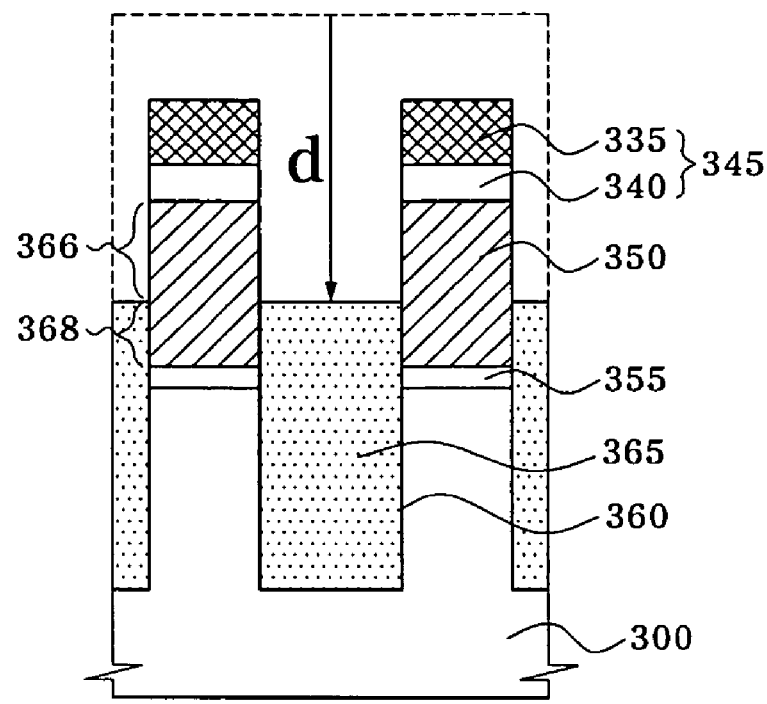

Referring to FIG. 5, the insulating layer 365 that fills the trench 360 is recessed to a predetermined depth "d" from a surface. The insulating layer 365 is etched until a partial sidewall 366 of the conductive pattern 350 is exposed. A lower portion 368 of the conductive pattern 350 is covered with the insulating layer 365. The insulating layer 365 may be recessed using an etchant that can etch an oxide film.

Figure 6:
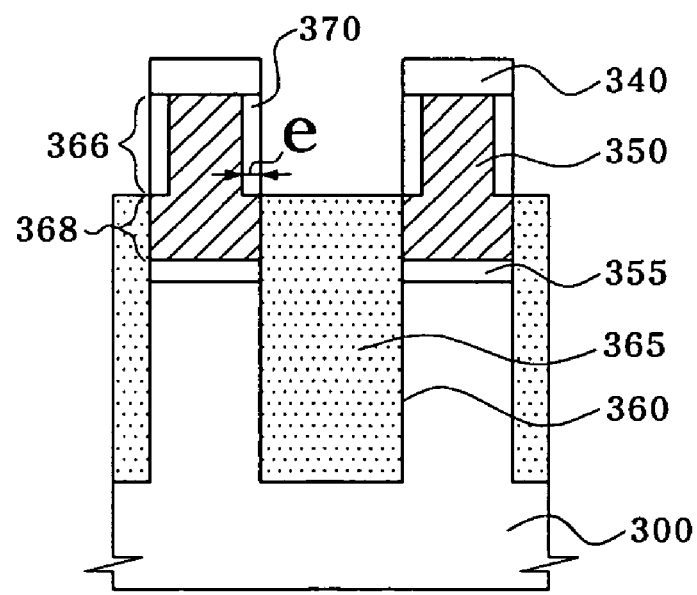

Referring to FIG. 6, an oxide film 370 having a predetermined thickness "e" is formed by etching the exposed partial sidewall 366 of the conductive pattern 350. More specifically, the semiconductor substrate 300 is loaded into a chamber. Next, a source gas containing oxygen ($O_2$) is supplied into the chamber at a process temperature of approximately 400° C. to approximately 550° C., and a pressure of approximately 0.1 Torr to approximately 2 Torr, and power is applied so as to form an oxygen ($O_2$) plasma in the chamber. The source gas includes an oxygen ($O_2$) gas, an argon (Ar) gas, and a hydrogen ($H_2$) gas. Power from approximately 3000 W to approximately 5000 W is applied while supplying the source gas. Next, a bias is applied to the chamber so that the oxygen plasma is adsorbed on the conductive pattern 350. The oxygen plasma may be adsorbed on the exposed partial sidewall 366 of the conductive pattern 350 by applying a relatively higher bias in a lateral direction rather than in a downward direction of the semiconductor substrate 300. As such, the exposed partial sidewall 366 of the conductive pattern 350 is oxidized so as to form the oxide film 370 to the predetermined thickness "e". The oxidation process using the oxygen plasma is performed for approximately 10 seconds to approximately 600 seconds, and may be performed for approximately 175 seconds. Because the lower portion 368 of the conductive pattern 350 is covered with the insulating layer 365, the lower portion 368 is not affected by the oxygen plasma and is not transformed to the oxide film.

Alternatively, the oxide film 370 may be formed by performing an oxidation process using oxygen radicals on the conductive pattern 350. In the oxidation process using the oxygen radicals, a source gas containing a mixture of oxygen and hydrogen, in a predetermined ratio, passes through a catalytic reactor to generate oxygen radicals, and then the oxygen radicals are drawn into a reactor to oxidize an exposed portion of the conductive pattern 350. More specifically, the oxygen radicals are generated by supplying a hydrogen gas with a flow rate of approximately 90 sccm to approximately 230 sccm while supplying an oxygen gas with a flow rate of approximately 4500 sccm to approximately 5500 sccm. Next, the exposed portion of the conductive pattern 350 is oxidized by supplying the generated oxygen radicals while maintaining a process temperature of approximately 650° C. to approximately 950° C. and a pressure of approximately 1 Torr to approximately 10 Torr to form the oxide film 370. The oxidation process using the oxygen radicals is performed for approximately 5 minutes to approximately 60 minutes, and may be performed for approximately 25 minutes. The oxidation process is performed on the conductive pattern 350 using the oxygen plasma or the oxygen radials. In the case of the thermal oxidation method, an oxidation source may be tunneled so that a portion covered with the insulating layer 365 may be oxidized. That is, the oxygen plasma or the oxygen radicals may be used to selectively oxidize only the exposed surface of the conductive pattern 350.

Figure 7:
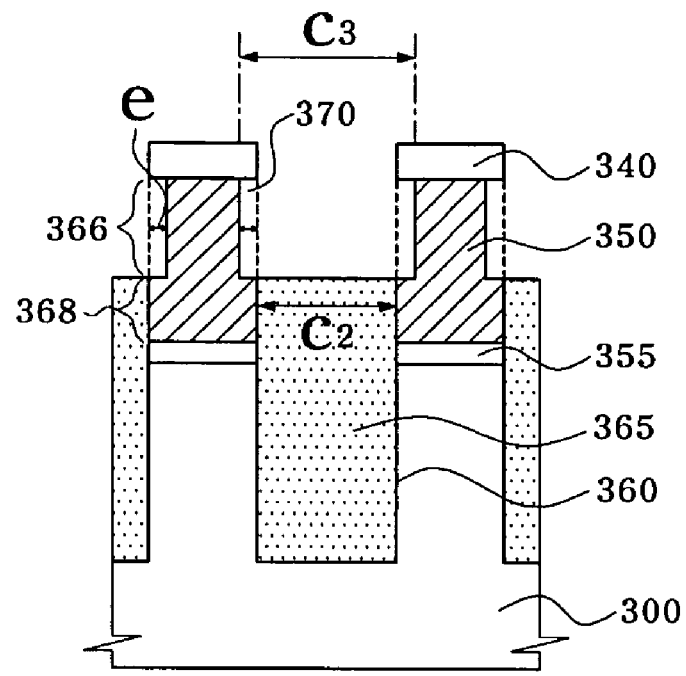

Referring to FIG. 7, the oxide film 370 formed on the conductive pattern 350 is removed by performing an etching process on the conductive pattern 350. Therefore, the gap "$c_3$" between the adjacent conductive patterns 350 increases by the thickness of the oxide film 370 removed by the etching process. Because the lower portion 368 of the conductive pattern 350 is covered with the insulating layer 365, the lower portion 368 is not affected by the etching process, and the gap "$c_2$" between the adjacent conductive patterns 350 remains unchanged. As such, because an upper width of the conductive pattern 350 is reduced and a width of the tunneling pattern 355 remains the same, it is now possible to obtain and ensure a desirable operating current of a device. An entire height of the conductive pattern 350 may be maintained by leaving the first hard mask pattern 340 on the conductive pattern 350. Alternatively, the first hard mask pattern 340 may be removed by etching it together with the oxide film 370. According to one embodiment, the hard mask pattern 345 includes the first hard mask pattern 340 and the second hard mask pattern 335 having different etching selectivity so that the first hard mask pattern 340 remains. The hard mask pattern 345 may not remain in order to simplify the process. Further oxidation and etching of the conductive pattern 350 may be performed depending on the removed thickness of the oxide film 370. A thickness of the oxide film 370 can be adjusted to be approximately 30% to approximately 80% of a target line width.

Figure 8:
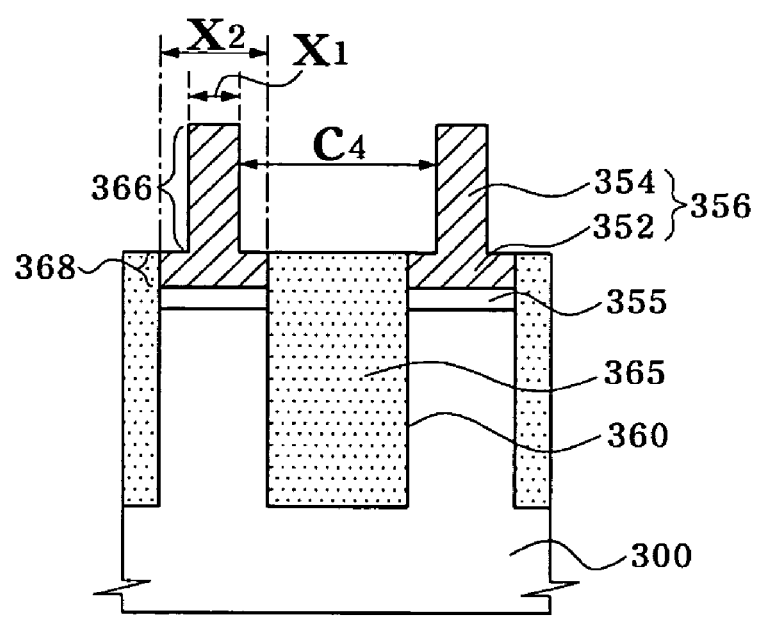

Referring to FIG. 8, a floating gate 356, which includes a base portion 352 and a protruding portion 354 having a width smaller than that of the base portion 352, is formed by performing one or more oxidation processes and one or more etching processes depending on a target thickness. As a width "$x_1$" of the protruding portion 354 is reduced by the oxidation process and the etching process, a gap $C_4$ between floating gates 356 increases. The width "$x_1$" of the protruding portion 354 of the floating gate 356 recessed by the oxidation process and the etching process is adjusted to be approximately 30% to approximately 80% of a line width of the base portion 352, and may be adjusted to be approximately 2 nm to approximately 10 nm. The oxidation process and the etching process may be controlled such that the tunneling pattern 355 is not oxidized and the base portion 352 of the floating gate 356 has a thickness of approximately 100 Å to approximately 300 Å.

The base portion 352 of the floating gate 356 may have a slope during the additional oxidation process and etching process. Because the base portion 352 of the floating gate 356 is covered with the insulating layer 365, the base portion 352 width, "$x_2$," is larger than the width "$x_1$" of the protruding portion 354 of the floating gate 356. The insulating layer 365 is etched to a predetermined depth while repeating the oxidation process and the etching process, thereby increasing an exposed portion of the protruding portion 354 of the floating gate 356. If the insulating layer 365 is excessively etched to expose the trench 360, a insulating layer may be additionally deposited in a following process. Next, the first hard mask pattern 340, which remains to maintain an entire height of the floating gate 356, is removed.

Figure 9:
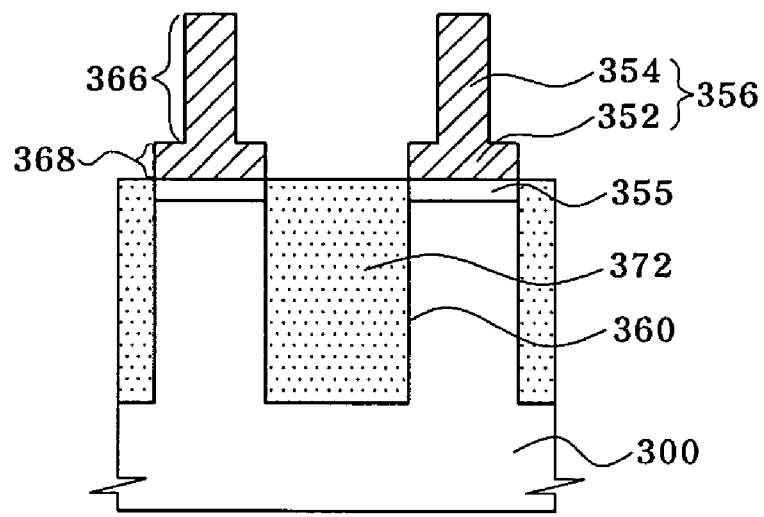

Referring to FIG. 9, the base portion 352 of the floating gate 356 is exposed. More specifically, the insulating layer 365 (shown in FIG. 8), covering the base portion 352 of the floating gate 356, is etched to expose the base portion 352. As the base portion 352 of the floating gate 356 is exposed, the insulating layer 365 serves as an isolation layer 372 defining an active region, and thereby minimizing interference between the adjacent floating gates 356.

Figure 10:
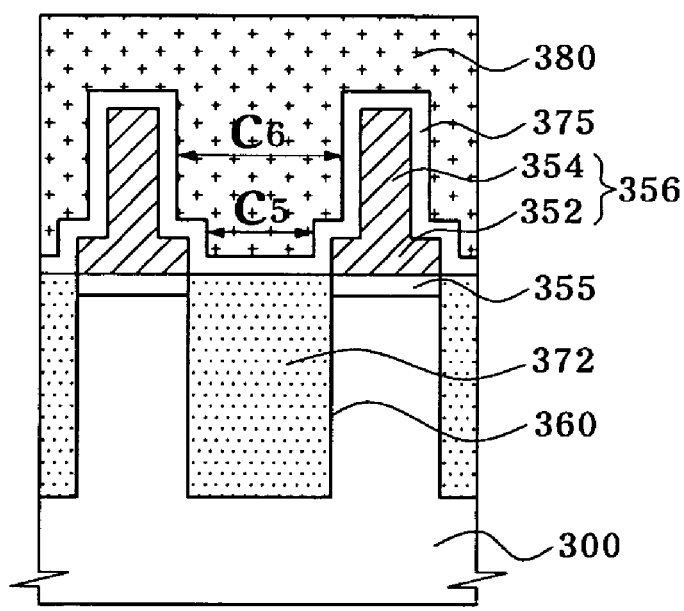

Referring to FIG. 10, a dielectric layer 375 is formed on the floating gate 356, which includes the base portion 352 and the protruding portion 354, and the isolation layer 372. The dielectric layer 375 extends along the base portion 352 and the protruding portion 354 of the floating gate 356. Next, a control gate 380 is formed on the dielectric layer 375 so as to fill a gap having a small width ("$c_5$") between the base portions 352 of adjacent floating gates 356, and a gap having a large width ("$c_6$") between the protruding portions 354 of adjacent floating gates 356. Because the floating gate 356 has a small upper width, the gap "$c_6$" can be sufficiently obtained between the adjacent floating gates 356 even though the device has high integration. In addition, because the floating gate 356 includes the lower portion having a large width and the upper portion having a small width, a contact area of the floating gate 356 and the dielectric layer 375 increases, thereby improving a coupling ratio compared with a floating gate having a gentle slope.

According to embodiments of the present invention, a semiconductor substrate is etched together when a floating gate is patterned. Next, an upper portion of the floating gate is recessed in an inward direction while maintaining a width of a lower portion of the floating gate by selectively performing an oxidation process and an etching process on the upper portion of the floating gate. Therefore, a gap between adjacent floating gates increases by a width of the recessed portion, thereby forming a minute device even though the integration of the device increases. As the floating gate includes the lower portion having a large width and the upper portion having a small width, a contact area of the floating gate and the dielectric layer increases, thereby improving a coupling ratio. In addition, because the width of the upper portion of the floating gate is reduced and a width of a tunneling layer remains the same, it is now possible to obtain and ensure a desirable operating current of the device. Furthermore, because the upper portion of the floating gate is controlled in a following process, it is now possible to etch the floating gate.

The foregoing description is given for clearness of understanding only, and no unnecessary limitations should be understood therefrom, as modifications within the scope of the invention may be apparent to those having ordinary skill in the art.

What is claimed is:

1. A method of fabricating a non-volatile memory device, the method comprising:
    forming a tunneling layer and a conductive layer on a semiconductor substrate;
    patterning each of the conductive layer, the tunneling layer, and the substrate to form a conductive pattern, a tunneling pattern, and a trench in the substrate;
    filling the trench with a insulating layer;
    exposing a partial sidewall of the conductive pattern;
    recessing the exposed partial sidewall of the conductive pattern in an inward direction to form a floating gate comprising a base portion and a protruding portion having a width smaller than that of the base portion;
    etching the insulating layer to form an isolation layer exposing the base portion of the floating gate;
    forming a dielectric layer, that extends along the base and protruding portions of the floating gate; and,
    forming a control gate that covers the base and protruding portions of the floating gate.

2. The method of claim 1, wherein the forming of the trench comprises:
    forming a hard mask pattern on the conductive layer; and
    etching the conductive layer, the tunneling layer, and the semiconductor substrate, using the hard mask pattern as an etch mask, to form the trench.

3. The method of claim 2, wherein the hard mask pattern comprises one or more films selected from the group consisting of a nitride film, an oxide film, and a polysilicon film.

4. The method of claim 2, wherein comprises removing the hard mask pattern after the floating gate is formed.

5. The method of claim 1, wherein the recessing of the conductive pattern further comprises:
    oxidizing the conductive pattern to form an oxide film on the exposed partial sidewall of the conductive pattern;
    etching the conductive pattern to remove the oxide film; and
    further oxidizing and etching the sidewall.

6. The method of claim 5, wherein oxidizing comprises oxidizing with an oxygen plasma or oxygen radicals.

7. The method of claim 6, wherein oxidizing with oxygen plasma comprises:
    applying power and supplying to the conductive pattern a source gas containing an oxygen ($O_2$) gas, an argon (Ar) gas, and a hydrogen ($H_2$) gas at a temperature of approximately 400° C. to approximately 550° C. and a pressure of approximately 0.1 Torr to approximately 2 Torr to form an oxygen plasma; and
    adsorbing the oxygen plasma on the conductive pattern.

8. The method of claim 7, wherein the step of adsorbing the oxygen plasma comprises applying a higher bias in a lateral direction relative to a downward direction of the semiconductor substrate to ensure that the oxygen plasma is absorbed on the exposed partial sidewall of the conductive pattern.

9. The method of claim 6, wherein oxidizing with oxygen radicals comprises catalytically reacting an oxygen gas and a hydrogen gas to generate oxygen radicals, and then supplying the oxygen radicals to the exposed partial sidewall of the conductive pattern.

10. The method of claim 5, wherein the oxide film has a thickness of approximately 30% to approximately 80% of a target line width of the conductive pattern.

11. The method of claim 5, wherein the oxide film removed by the etching process has a thickness of approximately 2 nm to approximately 10 nm.

12. The method of claim 1, wherein the exposed base portion of the floating gate has a thickness of approximately 100 Å to approximately 300 Å.

* * * * *